(12) United States Patent
Ha et al.

(10) Patent No.: US 10,445,175 B2
(45) Date of Patent: Oct. 15, 2019

(54) CONTROLLER AND OPERATING METHOD THEREOF

(71) Applicants: SK hynix Inc., Gyeonggi-do (KR); Korea Advanced Institute of Science and Technology, Daejeon (KR)

(72) Inventors: Jeong-Seok Ha, Daejeon (KR); Dae-Sung Kim, Gwangju (KR)

(73) Assignees: SK hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 302 days.

(21) Appl. No.: 15/626,230

(22) Filed: Jun. 19, 2017

(65) Prior Publication Data

US 2018/0067802 A1 Mar. 8, 2018

(30) Foreign Application Priority Data

Sep. 7, 2016 (KR) .................. 10-2016-0114923

(51) Int. Cl.
| | | |
|---|---|---|
| *G06F 11/10* | (2006.01) | |
| *G06F 9/30* | (2018.01) | |
| *G06F 12/0802* | (2016.01) | |
| *G06F 12/0866* | (2016.01) | |
| *G06F 13/16* | (2006.01) | |
| *G11C 29/04* | (2006.01) | |

(52) U.S. Cl.
CPC ........ *G06F 11/1068* (2013.01); *G06F 9/3004* (2013.01); *G06F 9/30007* (2013.01); *G06F 9/30101* (2013.01); *G06F 11/1012* (2013.01); *G06F 12/0802* (2013.01); *G06F 12/0866* (2013.01); *G06F 13/1673* (2013.01); *G11C 29/04* (2013.01); *G11C 2029/0409* (2013.01); *G11C 2029/0411* (2013.01)

(58) Field of Classification Search
CPC ............ G06F 11/1068; G06F 9/30007; G06F 9/3004; G06F 9/30101; G06F 11/1012; G06F 12/0802; G06F 12/0866; G06F 13/1673; G11C 29/04; G11C 2029/0409; G11C 2029/0411
USPC ....... 714/764, 768, 769, 770, 773, 774, 781, 714/786, 799, 752; 365/200, 201
See application file for complete search history.

(56) References Cited

U.S. PATENT DOCUMENTS

| | | | | |
|---|---|---|---|---|
| 7,930,622 | B2 * | 4/2011 | Oh .................... | H03M 13/1185 714/755 |
| 8,443,242 | B2 * | 5/2013 | Weingarten ........ | G06F 11/1068 714/704 |
| 9,727,414 | B2 * | 8/2017 | Cohen ................ | G06F 11/1096 |
| 2008/0256425 | A1 * | 10/2008 | Oh ..................... | H03M 13/1185 714/801 |
| 2008/0294963 | A1 * | 11/2008 | Hwang .............. | H03M 13/036 714/755 |

(Continued)

FOREIGN PATENT DOCUMENTS

KR 1020110101091 9/2011

*Primary Examiner* — John J Tabone, Jr.
(74) *Attorney, Agent, or Firm* — IP & T Group LLP

(57) ABSTRACT

An operation method of a controller may include encoding a first data at a first code rate such that the encoded first data is decoded by a first parity check matrix included in a variable code-rate parity check matrix and encoding a second data at a second code-rate such that the encoded second data is decoded by a second parity check matrix included in a variable code-rate parity check matrix.

20 Claims, 13 Drawing Sheets

(56) References Cited

U.S. PATENT DOCUMENTS

| | | | |
|---|---|---|---|
| 2010/0088557 A1* | 4/2010 | Weingarten | G06F 11/1068 714/704 |
| 2013/0073895 A1* | 3/2013 | Cohen | G06F 11/1096 714/6.2 |
| 2013/0246891 A1* | 9/2013 | Manning | G06F 11/108 714/773 |
| 2014/0040530 A1* | 2/2014 | Chen | G06F 11/1068 711/103 |
| 2014/0189421 A1* | 7/2014 | Werner | G06F 11/2056 714/6.21 |
| 2015/0074487 A1* | 3/2015 | Patapoutian | G06F 11/1012 714/758 |
| 2015/0287478 A1* | 10/2015 | Chen | G11C 29/26 714/719 |
| 2017/0004031 A1* | 1/2017 | Dick | G06F 11/1068 |
| 2017/0262332 A1* | 9/2017 | Barndt | G06F 11/073 |

* cited by examiner

<IDEAL>

CONTROLLER AND OPERATING METHOD THEREOF

CROSS-REFERENCE TO RELATED APPLICATIONS

The present application claims priority to Korean Patent Application No. 10-2016-0114923, filed on Sep. 7, 2016, which is incorporated herein by reference in its entirety.

BACKGROUND

1. Field

Various exemplary embodiments of the present invention relate to a controller and an operating method thereof.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory devices retain their stored data even when their power supplies are interrupted. Nun-volatile flash memory devices are widely used as storage mediums in computer systems due to their high program speed low power consumption and large data storage capacity.

In non-volatile memory devices, especially in flash memory devices the data state of each memory cell depends on the number of bits that the memory cell can program. A memory cell storing 1-bit data per cell is called a single-bit cell or a single-level cell (SLC). A memory cell storing multi-bit data that is, 2 or more bits of data per cell is called a multi-bit cell, a multi-level cell (MLC) or a multi-state cell. An MLC is advantageous for high integration. However, as the number of bits programmed in each memory cell increases, the reliability decreases and the read failure rate increases.

For example, when k bits are programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for threshold voltage distributions is finite. Therefore, as the value k increases, the distance between the threshold voltage distributions decreases and the neighbouring threshold voltage distributions may overlap. As the neighbouring threshold voltage distributions overlap, read data may include error bits.

FIG. 1 is a threshold voltage distribution schematically illustrating program and erase states of a 3-bit MLC non-volatile memory device.

FIG. 2 is a threshold voltage distribution schematically illustrating program and erase states due to characteristic deterioration of the 3-bit MLC non-volatile memory device.

In an MLC non-volatile memory device, for example, an MLC flash memory device capable of storing k-bit data in a single memory cell, the memory cell may have one of $2^k$ threshold voltage distributions. For example, the 3-bit. MLC has one of 8 threshold voltage distributions.

Threshold voltages of memory cells programmed for the same data form a threshold voltage distribution due to characteristic differences between memory cells. In the 3-bit MLC non-volatile memory device, as illustrated in FIG. 1, threshold voltage distributions are formed in correspondence with the data states including 7 program state 'P1' to 'P7' and an erase state 'E'. FIG. 1 shows an ideal case In which threshold voltage distributions do not overlap and have sufficient read voltage margins therebetween.

Referring to the flash memory example of FIG. 2, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency may cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. That is, when the neighbouring threshold voltage distributions overlap as illustrated in FIG. 2, read data may include a significant number of errors.

What is therefore required is a method for precisely reading data stored in memory cells of a semiconductor memory device.

SUMMARY

Various embodiments of the present invention are directed to a controller capable of precisely reading data stored in memory cells of the semiconductor memory device, and an operating method thereof.

In accordance with an embodiment of the present invention, an operation method of a controller may include: encoding a first data at a first code-rate such that the encoded first data is decoded by a first parity check matrix included in a variable code-rate parity check matrix; and encoding a second data at a second code-rate such that the encoded second data is decoded by a second parity check matrix included in a variable code-rate parity check matrix.

Preferably, the operation method may further include storing the encoded first data into a first page of a memory block; and storing the encoded second data into a second page of the memory block.

Preferably, the operation method may further include storing the encoded first data into a first page of respective memory blocks; storing a first portion of the encoded second data into the first page of the respective memory blocks; and storing a second portion of the encoded second data into a second page of the respective memory blocks, wherein a summed size of the encoded first data and the first portion of the encode second data stored in the first page is the same as a size of the second portion of the encoded second data stored in the second page.

Preferably, the first parity check matrix may be included in the second parity check matrix.

Preferably, the first code-rate may be higher than the second code-rate.

Preferably, in the variable code-rate parity check matrix, elements located at first to (n−k+i)th rows and (n+i+1)th to (n+m)th columns may have a value of zero (0), and the k may represent a size of the first data, the n may represent a number of columns of the first parity check matrix, the m may represent a number of columns of the variable code-rate parity check matrix minus the number of columns of the first parity check matrix, and the i may represent an integer between zero (0) and (m−1).

Preferably, in the variable code-rate parity check matrix, diagonal elements located on diagonal line running through locations at a first row and (k+1)th column and a (n−k+m)th row and a (n+m)th column and elements located above the diagonal elements may have a value of zero (0).

In accordance with an embodiment of the present invention, an operation method of a controller may include: reading a first data, which is encoded at a first code-rate, and a second data, which is encoded at a second code-rate, from respective memory blocks; decoding the first data through a first parity check matrix included in a variable code-rate parity check matrix; and decoding the second data through a second parity check matrix included in the variable code-rate parity check matrix.

Preferably, the first data may be stored in a first page of the respective memory blocks, and wherein the second data may be stored in a second page of the respective memory blocks.

Preferably, the first data may be a first portion of data stored in a first page of the respective memory blocks, the second data may a second portion of data stored in the first page of the respective memory blocks and data stored in a second page of the respective memory blocks, and a size of data stored in the first page may be the same as a size of data stored in the second page.

Preferably, the first parity check matrix may be included in the second parity check matrix.

Preferably, the first code-rate may be higher than the second code-rate.

Preferably, in the variable code-rate parity check matrix, elements located at first to (n−k+i)th rows and (n+i+1)th to (n+m)th columns may have a value of zero (0), and the k may represent a size of the first data, the n may represent a number of columns of the first parity check matrix, the m may represent a number of columns of the variable code-rate parity check matrix minus the number of columns of the first parity check matrix, and the i may represent an integer between zero (0) and (m−1).

Preferably, in the variable code ate parity check matrix, diagonal elements located on diagonal line running through locations at a first row and (k+1)th column and a (n−k+m)th row and a (n+m)th column and elements located above the diagonal elements may have a value of zero (0).

In accordance with an embodiment of the present invention, a controller may include: a first means for encoding a first data at a first code-rate and for encoding a second data at a second code-rate; a second means for storing the encoded first and second data into respective memory blocks; a third means for reading the encoded first data and the encoded second data from the respective memory blocks; and a fourth means for decoding the encoded first data through a first parity check matrix included in a variable code-rate parity check matrix, and decoding the encoded second data through a second parity check matrix included in the variable code-rate parity check matrix.

Preferably, the second means may store the encoded first data into a first page of the respective memory blocks, and the encoded second data into a second page of the respective memory blocks.

Preferably, the second means may store the encoded first data into a first page of the respective memory blocks, a first portion of the encoded second data into the first page of the respective memory blocks, and a second portion of the encoded second data into a second page of the respective memory blocks, and a summed size of the encoded first data and the first portion of the encoded second data stored in the first page may be the same as a size of the second portion of the encoded second data stored in the second page.

Preferably, the first parity check matrix may be included in the second parity check matrix.

Preferably, in the variable code-rate parity check matrix, elements located at first to (n−k+i)th rows and (n+i+1)th to (n+m)th columns may have a value of zero (0), and the k may represent a size of the first data, the n may represent a number of columns of the first parity check matrix, the m may represent a number of columns of the variable code-rate parity check matrix minus the number of columns of the first parity check matrix, and the i may represent an integer between zero (0) and (m−1).

Preferably, in the variable code-rate parity check matrix, diagonal elements located on diagonal line running through locations at a first row and (k+1)th column and a (n−k+m)th row and a (n+m)th column and elements located above the diagonal elements may have a value of zero (0).

In accordance with various embodiments of the present invention, data stored in memory cells of a semiconductor memory device may be precisely read.

BRIEF DESCRIPTION OF THE DRAWINGS

These and other features and/or advantages of the present invention will become apparent to those skilled in the art to which this invention belongs in view of the following description of various embodiments of the present invention in reference to the accompanying drawings in which.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the present invention to those skilled in the art. The scope of the present invention will be understood through the claims of the present invention.

It is noted that the drawings are not necessarily to scale and, in some instances, proportions may have been exaggerated in order to more clearly illustrate the various elements of the embodiments.

Also, in the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature, described in connection with one embodiment may be used singly or in combination with other elements of another embodiment, unless specifically indicated otherwise.

Hereinafter, the various embodiments of the present invention ill be described in detail with reference to the attached drawings.

Figure 1:
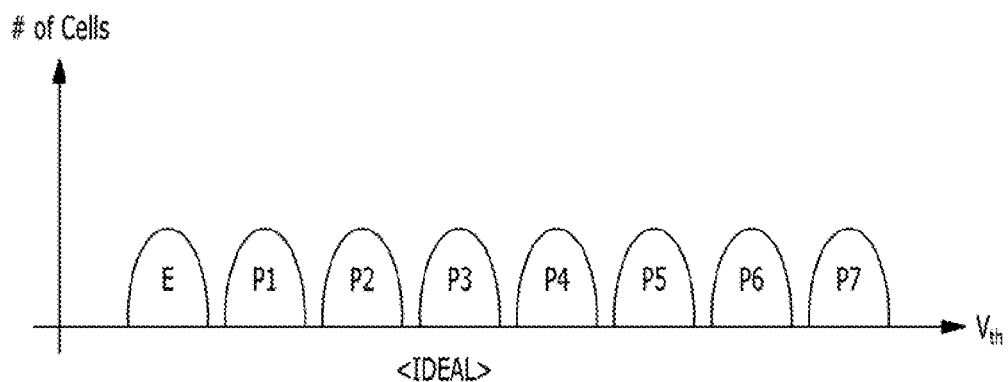
FIG. 1 is a threshold voltage distribution schematically illustrating program and erase states of a 3-bit MLC non-volatile memory device.
Figure 2:
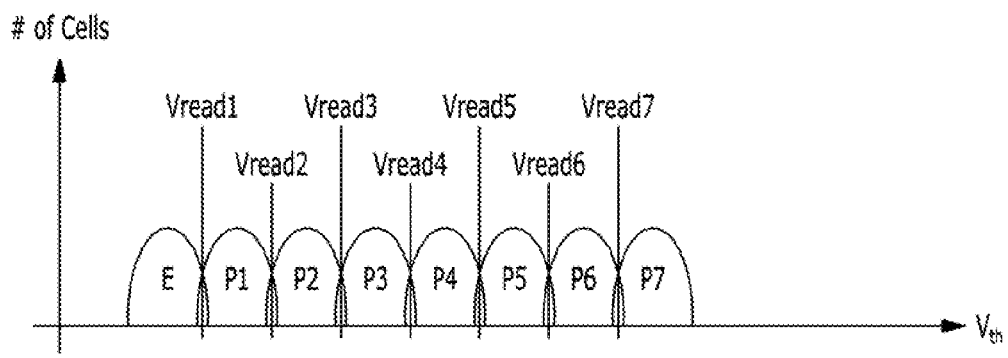
FIG. 2 is a threshold voltage distribution schematically illustrating program and erase states due to characteristic deterioration of a 3-bit MLC non-volatile memory device.
Figure 3:
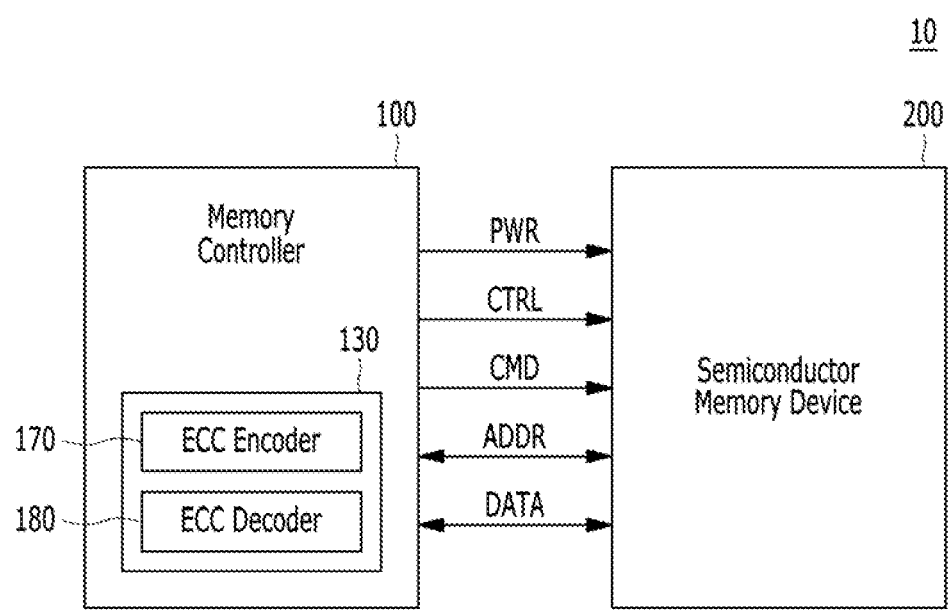
FIG. 3 is a block diagram schematically illustrating semiconductor memory system, in accordance with an embodiment of the present invention.
Figure 4A:
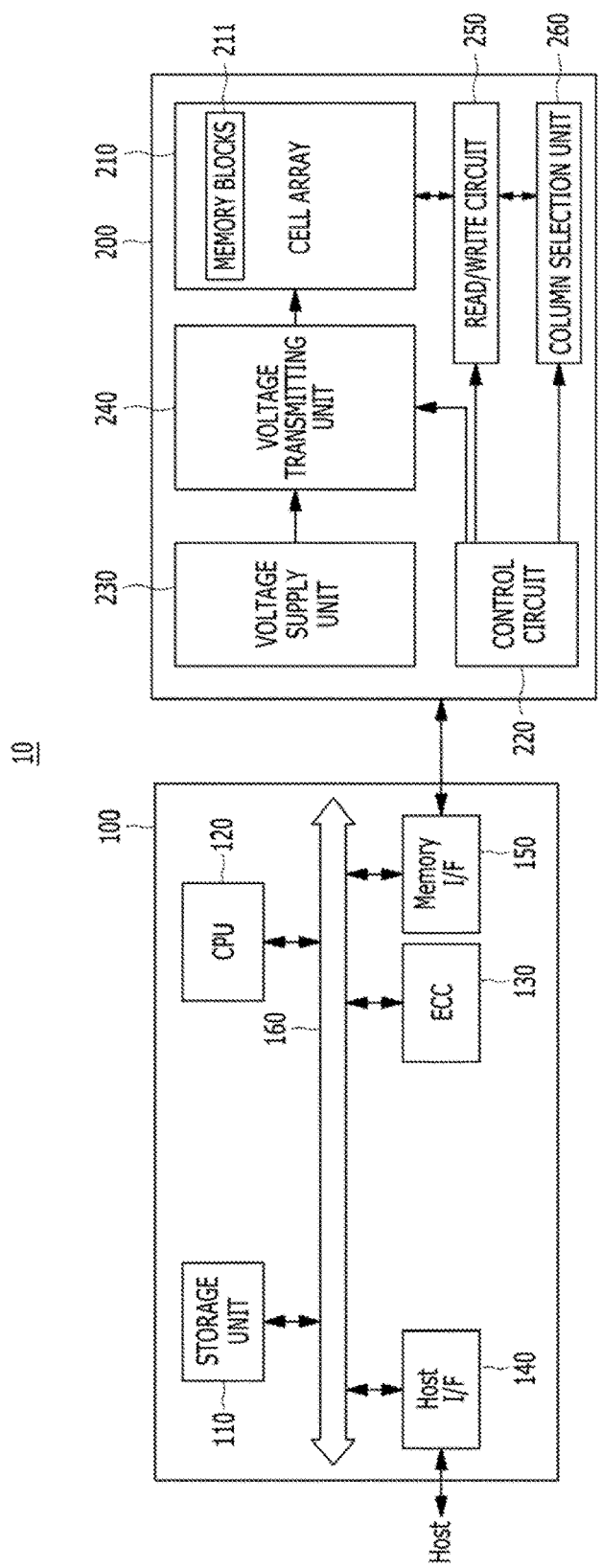
FIG. 4A is a detailed block diagram illustrating semiconductor memory system of FIG. 3.
Figure 4B:
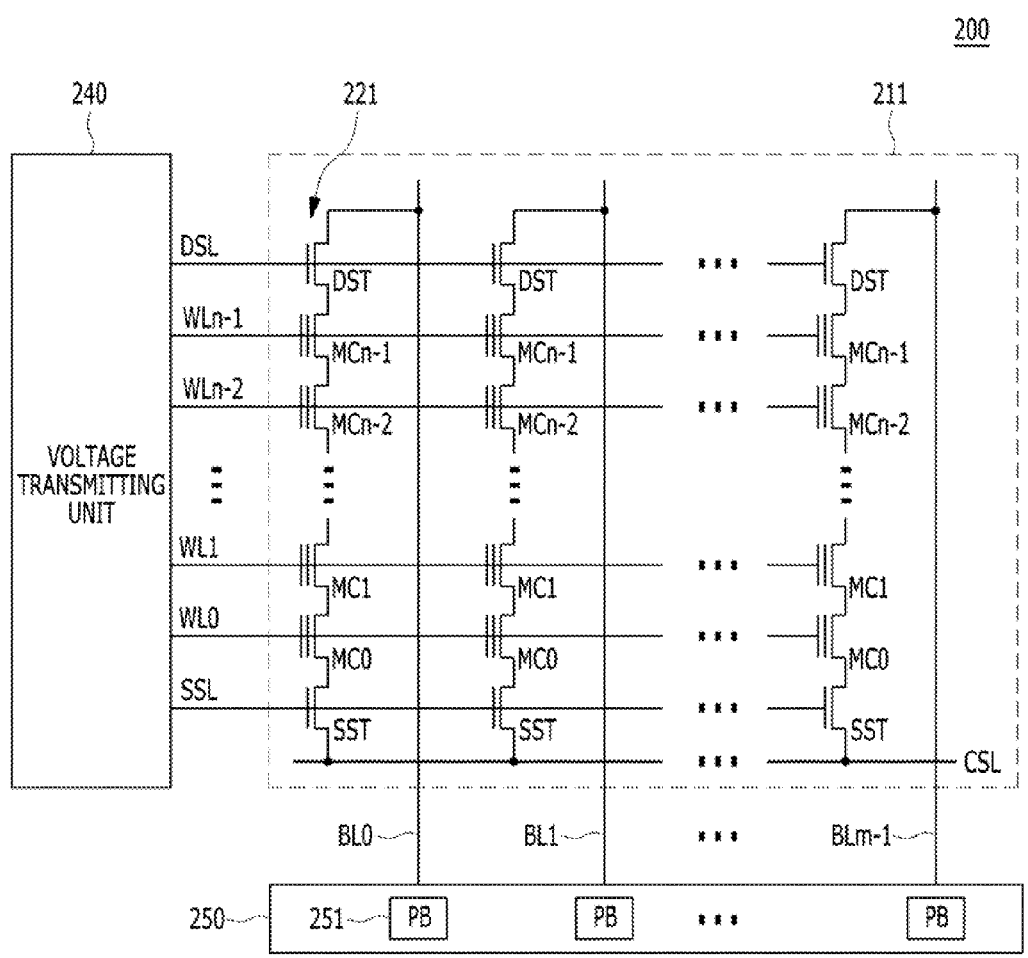
FIG. 4B is a circuit diagram illustrating an exemplary configuration of a memory block employed in the semiconductor memory system of FIG. 4A.
Figure 5:
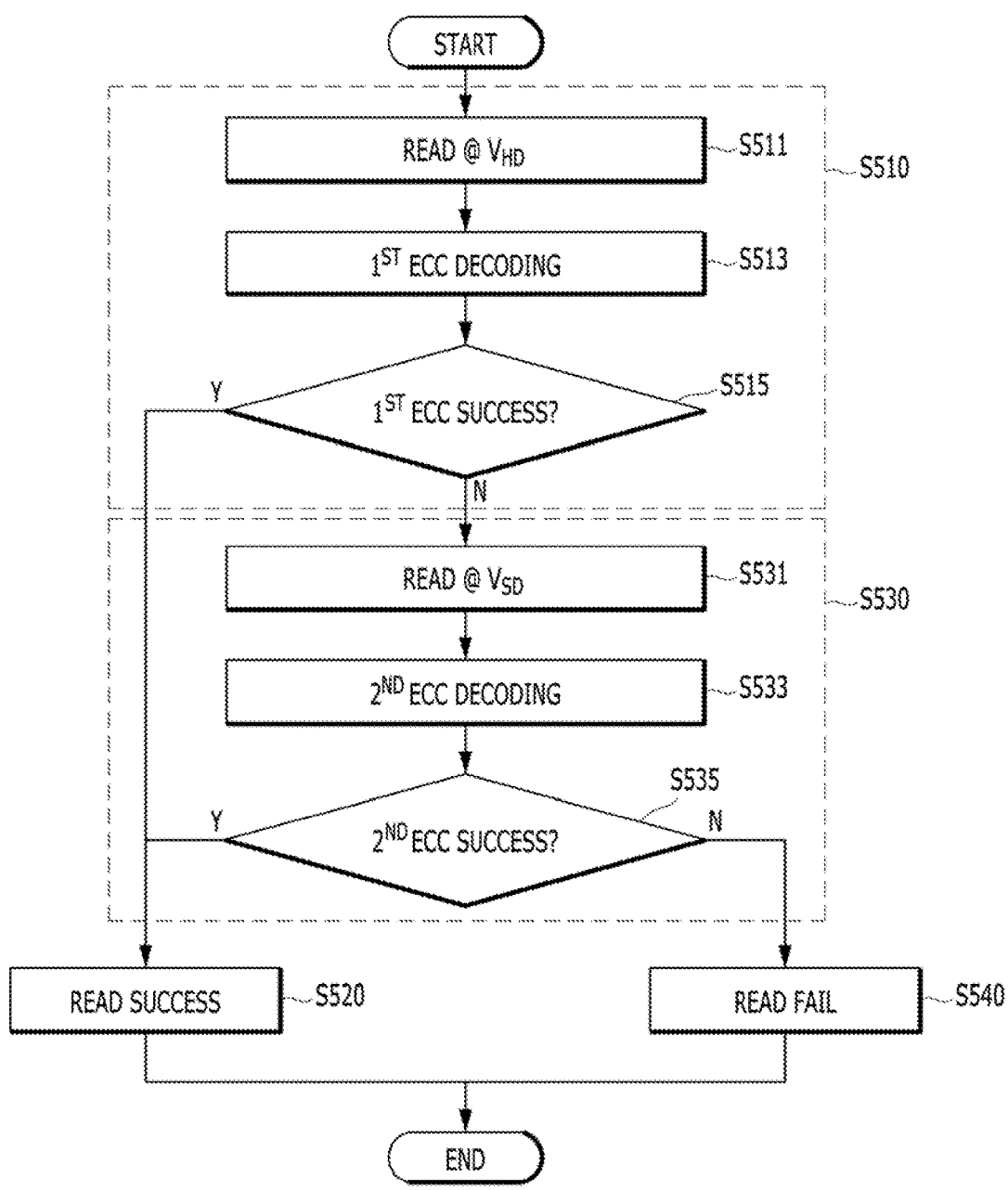
FIG. 5 is a flowchart illustrating an operation of a memory controller employed in the semiconductor memory system shown in FIG. 4A.

FIG. 3 is a block diagram schematically illustrating semiconductor memory system 10 in accordance with an embodiment of the present invention. FIG. 4A is a detailed block diagram illustrating the semiconductor memory system 10 of FIG. 3. FIG. 4B is a circuit diagram illustrating an exemplary configuration of a memory block employed in the semiconductor memory system 10 of FIG. 4A. FIG. 5 is a flowchart illustrating an operation of a memory controller 100 employed in the semiconductor memory system shown in FIG. 4A.

Referring now to FIGS. 3 to 5 the semiconductor memory system 10 may include the semiconductor memory device 200 and the memory controller 100 operatively coupled to the semiconductor memory device 200.

The semiconductor memory device 200 may perform one or more of an erase, a program, and a read operation under the control of the memory controller 100. The semiconductor memory device 200 may receive a command CMD, an address ADDR and data DATA through a plurality of input/output lines from the memory controller 100. The semiconductor memory device 200 may receive power PWR through a power line and a control signal CTRL through a control line from the memory controller 100. The control signal may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include an ECC unit 130 for correcting error bits. The ECC unit 130 may include an ECC encoder 170 and an ECC decoder 180.

The ECC encoder 170 may perform error correction encoding on data to be programmed into the semiconductor memory device 200 to output data to which parity bits are added. The encoded data with the parity bits may be stored in the semiconductor memory device 200.

The ECC decoder 180 may perform an error correction decoding operation on data read from the semiconductor memory device 200. The ECC decoder 180 may determine whether the error correction decoding operation is successful, and may output an instruction signal based on the determination result. The ECC decoder 180 may correct error bits of data using the parity bits generated by the ECC encoding operation.

When the number of error bits exceeds the error correction capacity of the ECC unit 130, the ECC unit 130 may not correct the error bits. In this case, the ECC unit 130 may generate an error correction fail signal.

The ECC unit 130 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The ECC unit 130 may correct an error through a low-density parity-check (LDPC) code. The ECC unit 130 may include all circuits, systems, or devices for error correction.

The ECC unit 130 may perform an error bit correcting operation using hard decision read data and/or soft decision read data. In an embodiment the ECC unit 130 may perform an error bit correcting operation using soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 maybe remarkably improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic apparatus such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic apparatuses of a home network, one of electronic apparatuses of a computer network, one of electronic apparatuses of a telematics network, an radio-frequency identification (RFID) device, or a computing system.

Referring to FIG. 4A, in an embodiment, the memory controller 100 may include, in addition to the ECC unit 130, a storage unit 110, a CPU 120, a host interface 140, a memory interface 150 and a system bus 160.

The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 130 may detect and correct errors included in the data read from the semiconductor memory device 200. The memory interface 150 may interface with the semiconductor memory device 200. The ECC encoder 170 and the ECC decoder 180 may be implemented as different and independent components even though FIG. 4A exemplarily shows the ECC unit 130 including both the ECC encoder 170 and the ECC decoder 180. The CPU 120 may perform various control operations.

In accordance with an exemplary embodiment of the present invention, during a program operation, the ECC unit 130 may perform an ECC encoding operation to an original data which is to be programmed to the semiconductor memory device 200. In such case, during the read operation, the ECC unit 130 may perform an ECC decoding operation to the ECC-encoded data or a codeword, which is stored in the semiconductor memory device 200.

An original data is data received from the host before being encoded ECC by the encoding operation of the ECC unit 130 during a program operation. The ECC-encoded data are stored in the semiconductor memory device 200. The ECC unit 130 may then restore the original data by performing an ECC decoding operation to the ECC-encoded data or the codeword stored in the semiconductor memory device 200.

As discussed with reference to FIG. 5, the read operation to the data stored in the semiconductor memory device 200 may include a hard decision read operation of step S511 and a soft hard decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which have different levels than the hard decision read voltage $V_{HD}$. For example, an additional read operation according to the soft decision read voltages $V_{SD}$ may be performed to the memory cell, which is read according to the hard decision read voltage $V_{HD}$.

The ECC-encoded data or the codeword, which is stored in the semiconductor memory device 200 and is read through the hard decision read operation, may be decoded back to the original data by the ECC unit 130.

The soft decision read operation includes generating a log likelihood ratio (LLR), which provides the reliability of the hard decision read data read through the hard decision read operation, according to the soft decision read voltages $V_{SD}$ rather than just the read operation to data stored in the semiconductor memory device 200.

The ECC unit 130 may perform the ECC decoding operation to the LLR. The ECC unit 130 may detect and correct the error of the ECC-encoded data or the codeword read from the semiconductor memory device 200 through the LLR scheme.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211. The user data may be encoded as described above.

Referring to FIG. 4B, an exemplary configuration of the memory block 211 may include a plurality of cell strings 221 coupled to bit lines BL0 to BLm-1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn-1 may be preferably formed of a multi-level cell (MLC) storing data information of multiple bits in each cell. The cell strings 221 may be electrically coupled to the corresponding bit lines BL0 to BLm-1, respectively.

FIG. 4B exemplarily illustrates a memory block 211 comprising a NAND-type flash memory cell. However, the memory block 211 of the semiconductor memory device 200 is not limited to being NAND flash memory. For example, the memory block 211 may comprise a NOR-type flash memory, a hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating leer, as well as the flash memory device in which a charge storing layer is formed by a conductive floating gate.

Referring back to FIG. 4A, the control circuit 220 may control overall operations including operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selection unit 260 may output the data read from the read/write circuit 250 to the outside, for example, to the memory controller 100, based on column address information. On the other hand, during a verification read operation, the read data may be provided to a pass/fail verification circuit (not illustrated) included in the semiconductor memory device 200, and may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive data to be written in the memory cell array 210 from a buffer (not illustrated) and may drive the bit lines according to the input data. The read/write circuit 250 may include a plurality of page buffers (PB) 251 corresponding to the columns or the bit lines or column pairs or bit line pairs, respectively. A plurality of latches may be included in each of the page buffers 251.

Referring to FIGS. 4A and 5, the operation of the memory controller 100 may include a hard decision decoding step S510, and may additionally include a soft decision decoding step S530. A target data of the hard and soft decision decoding steps S510 and S530, or the data stored in the semiconductor memory device 200 may be the ECC-encoded data or the codeword, which is ECC-encoded by the ECC unit 130.

For example, the hard decision decoding step S510 may be a step of a hard decision ECC decoding operation to hard decision read data of a predetermined length, which is read from a memory cell of the memory block 211 according to the hard decision read voltage $V_{HD}$. The hard decision decoding step S510 may include steps S511 to S515.

For example, the soft decision decoding step S530 may be a step of a soft decision ECC decoding operation to the hard decision read data by forming soft decision read data according to soft decision read voltages $V_{SD}$ around the hard decision read voltage $V_{HD}$ when the hard decision ECC decoding operation of the hard decision decoding step S510 finally fails. The soft decision decoding step S530 may include steps S531 to S535.

As described above, at step S511 of the hard decision read step, the hard decision read data may be read from the semiconductor memory device 200 according to the hard decision read voltage $V_{HD}$. The memory controller 100 may provide a read command and an address to the semiconductor memory device 200. The semiconductor memory device 200 may read the hard decision read data therefrom according to the hard decision read voltage $V_{HD}$ in response to the read command and the address. The hard decision read data may be provided to the memory controller 100.

At step S513 a first error correction decoding operation is performed which may be a hard decision LDPC decoding operation. The ECC unit 130 may perform the hard decision LDPC decoding operation to the hard decision read data, which is read from the semiconductor memory device 200 according to the hard decision read voltage $V_{HD}$ by using the error correction code.

At step S515, it may be determined whether the first error correction decoding operation, that is, the hard decision ECC decoding operation is a success or a fail. At step S515, it may be determined whether an error of the hard decision read data, to which the hard decision ECC decoding operation is performed at step S513, is corrected. For example, the memory controller 100 may determine whether an error of the hard decision read data is corrected by using the hard decision read data and a parity check matrix. For example, when a product result of the parity check matrix and the hard decision read data is a zero vector ('0'), it may be determined that the hard decision read data is corrected. Alternatively, when the product result of the parity check matrix and the hard decision read data is not the zero vector ('0') it may be determined that the hard decision read data is not corrected.

When it is determined that the hard decision read data is corrected as the result of the determination of step S515, it may be determined at step S520 that the read operation according to hard decision read voltage $V_{HD}$ at step S511 is successful and the operation of the memory controller 100 may end. The hard decision read data, to which the hard decision ECC decoding operation is performed at step S513, may be the error-corrected data and may be provided externally or used in the memory controller 100.

When it is determined that the hard decision read data is not corrected as the result of the determination of step S515, a second error correction decoding operation may be performed in step S530 which may be a soft decision decoding operation.

As described above, at step S531 of the soft decision read step, the soft decision read data may be read from the semiconductor memory device 200 according to the soft decision read voltages $V_{SD}$. For example, the additional read operation according to the soft decision read voltages $V_{SD}$ may be performed to the memory cell to which the hard decision decoding step S510 is performed according to the hard decision read voltage $V_{HD}$. The soft decision read voltages $V_{SD}$ may be different from the hard decision read voltage $V_{HD}$.

At step S533, the soft decision ECC decoding operation as the second error correction decoding operation may be performed. The soft decision ECC decoding operation may be performed based on the soft decision read data comprising the hard decision read data, to which the hard decision ECC decoding operation is performed, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn-1 of the semiconductor memory device 200 may belong to one of the threshold voltage distributions including 7 program states P1 to P7 and 1 erase state E.

The hard decision read voltage $V_{HD}$ may have a level between 2 neighbouring states of the plurality of states E and P1 to P7. Each of the soft decision read voltages $V_{SD}$ may have a level, which is different from the hard decision read voltage $V_{HD}$, between 2 neighbouring states of the plurality of states E and P1 to P7.

The hard decision read data read from the memory cells MC0 to MCn-1 according to the hard decision read voltage $V_{HD}$ and the soft decision read data read therefrom according to the soft decision read voltages $V_{SD}$ may have different values. For example, there may be a tailed memory cell among the memory cells MC0 to MCn-1 having a threshold voltage that is higher or lower than the threshold voltage distribution of the normal logic state. The hard decision read data read from the tailed memory cell according to the hard decision read voltage $V_{HD}$ and the soft decision read data read therefrom according to the soft decision read voltages $V_{SD}$ may have different values. When the additional read operation according to the soft decision read voltages $V_{SD}$ is performed as well as the read operation according to the hard decision read voltage $V_{HD}$, additional information on the threshold voltages of the memory cells MC0 to MCn-1 that is, additional information on the tailed memory cells, or the log likelihood ratio (LLR) providing reliability of the hard decision read data read by the hard decision read operation may be obtained.

When the additional information is obtained, the probability of the likelihood ratio which indicates whether the data of the memory cells MC0 to MCn-1 belong to the first state (i.e., '1'), or the second state (i.e., '0'), may increase. That is, the reliability of the ECC decoding operation may increase. The memory controller 100 may perform the soft decision ECC decoding operation based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 7A and 7B.

At, step S535 it may be determined whether the second error decoding operation, that i, the soft decision ECC decoding operation succeeds or fails. At step S535, it may be determined whether an error of the soft decision read data to which the soft: decision ECC decoding operation is performed at step S533, is corrected. For example, the memory controller 100 may determine whether an error of the soft decision read data is corrected by using the soft decision read data and the parity check matrix. For example, when the result of the parity check matrix and the soft decision read data is a zero vector ('0'), it may be determined that the soft decision read data, to which the soft decision ECC decoding operation is performed, is corrected. Alternatively, when the result of the parity check matrix and the soft decision read data is not a zero vector ('0'), it may be determined that the soft decision read data, to which the soft decision ECC decoding operation is performed, is not corrected.

The product process of the parity check matrix and the hard decision read data during the hard decision decoding step S510 may be the same as the product process of the parity check matrix and the soft decision read data during the soft decision decoding step S530. The product process may be the matrix product.

When it is determined that the soft decision read data is corrected as the result of determination of step S535, it may be determined at step S520 that the read operation according to soft decision read voltage $V_{SD}$ at step S531 is successful and the operation of the memory controller 100 may end. The soft decision read data, to which the soft decision ECC decoding operation is performed at step S533, may be now the error-corrected data and may be provided externally or used in the memory controller 100.

When it is determined that the soft decision read data is not corrected as the result of determination of step S535, it may be determined at step S540 that the read operation of the memory controller 100 to the memory cells MC0 to MCn-1 finally fails and the operation of the memory controller 100 may end.

Figure 6A:
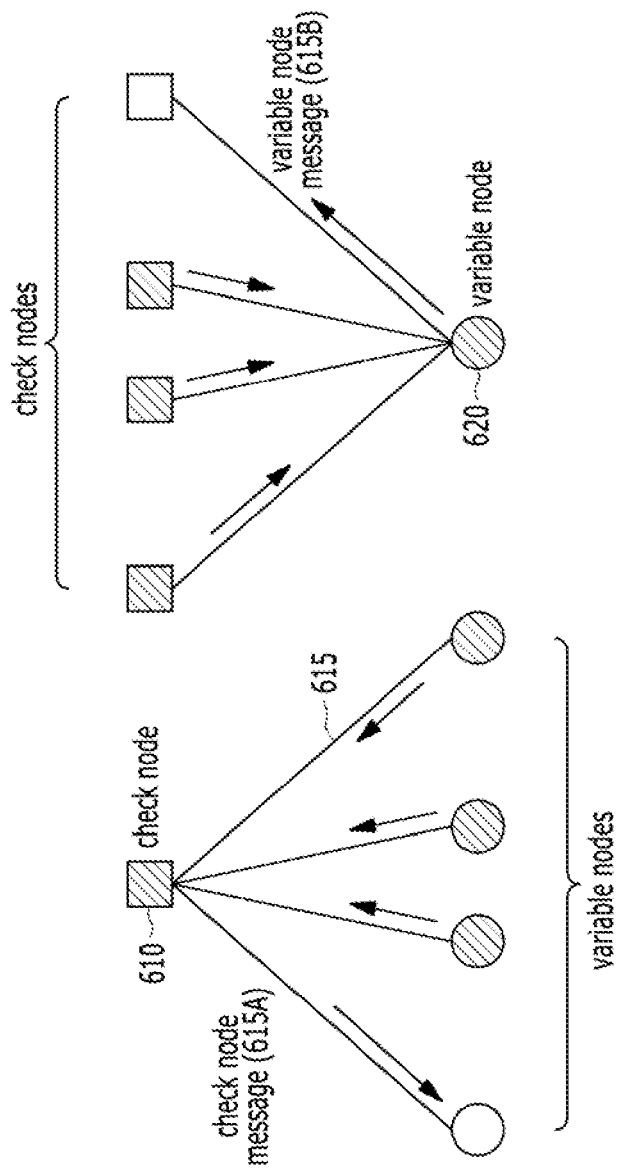
FIG. 6A is a schematic diagram illustrating LDPC decoding operation represented by a Tanner graph.

FIG. 6A is a schematic diagram illustrating an LDPC decoding operation using a Tanner graph.

Figures 6B, 6C:
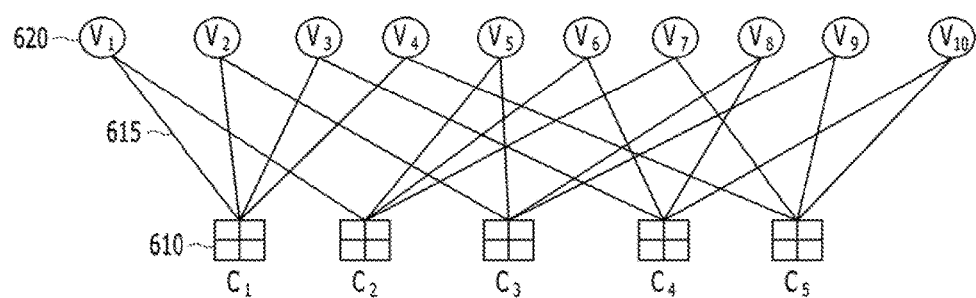
FIG. 6B is a schematic diagram illustrating an LDPC code.
FIG. 6C is a schematic diagram illustrating a syndrome check process according to an LDPC decoding operation.

FIG. 6B is a schematic diagram illustrating an LDPC code.

FIG. 6C is schematic diagram illustrating a syndrome check process according to the LDPC decoding operation.

An error correction code (ECC) is commonly used in storage systems. Various physical phenomena occurring in storage devices result in noise effects that corrupt the stored information. Error correction coding methods can be used for protecting the stored information against the resulting errors. This is done by encoding the information before storing the information in the memory device. The encoding process transforms the information bit sequence into a codeword by adding redundancy to the information. This redundancy can then be used in order to recover the information from the possibly corrupted codeword through a decoding process.

In iterative coding methods, the code is constructed as a concatenation of several simple constituent codes and is decoded based on an iterative decoding algorithm by exchanging information between decoders receiving the simple constituent codes. Usually, the code can be defined using a bipartite graph or a Tanner graph describing interconnections between the constituent codes. In this case, a decoding operation can be viewed as an iterative message passing over the graph edges.

The iterative codes may include the low-density parity-check (LDPC) code. The LDPC code is a linear binary block code defined by a sparse parity-check matrix H.

Referring to FIG. 6A, the LDPC code has a parity check matrix in which the number of 1s in each row and column is very small, and its structure can be defined by the Tanner graph including check nodes 610, variable nodes 620, and edges 615 connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 615B.

An initial value of the variable node 620 may be one of the hard decision read data and the soft decision read data.

A decoding process of the LDPC code may be performed by an iterative decoding operation based on a 'sum-product' algorithm. A decoding method can be provided based on a suboptimal message-passing algorithm such as a 'min-sum' algorithm, which is a simplified version of the sum-product algorithm.

For example, referring to FIG. 6B, the Tanner graph of the LDPC code may include 5 check nodes 610 representing parity check equations of the LDPC code, 10 variable nodes 620 representing code symbols, and edges 615 representing relationships between the check nodes 610 and the variable nodes 620. The edges 615 connect each check node 610 to the variable node 620 corresponding to a code symbol included in the parity check equations represented by the check nodes 610. FIG. 6B exemplarily illustrates a regular LDPC code in which the number of variable nodes 620 coupled to each of the check nodes 610 is fixed at 4 and the number of the check nodes 610 coupled to each of the variable nodes 620 is fixed at 2.

FIG. 6C shows a parity check matrix H corresponding to the Tanner graph. The parity check matrix H is similar to the graphic expression of the parity check equations. The parity check matrix H has the same number of 1s in each column. That is, each column of the parity check matrix H has two 1s corresponding to the connections between each of the variable nodes 620 and the check nodes 610. The parity check matrix H has the same number of 1s in each row, that is, each row has four 1s corresponding to the connections between each of the check nodes 610 and the variable nodes 620.

A process of decoding the LDPC code is performed by iterating a process of exchanging messages, which are generated and updated in each node, between the variable nodes 620 and the check nodes 610 in the Tanner graph. In this case, each node updates the messages based on the sum-product algorithm or a similar suboptimal algorithm.

For example, the LDPC decoding operation to the hard decision read data may comprise a plurality of iterations, each of which includes an update of the check nodes 610 after an initial update of the variable nodes 620, an update of the variable nodes 620, and a syndrome check. After a first iteration, when the result of the syndrome check satisfies a predetermined condition, the LDPC decoding operation may end. When the result of the syndrome check does not satisfy the predetermined condition, an additional iteration may be performed. The additional iteration may include the variable node update, the check node update and the syndrome check. The number of iterations may be limited to a maximum iteration count. When the result of the syndrome check does not satisfy the predetermined condition until the number of iterations reaches the maximum iteration count, the LDPC decoding operation to the codeword may be determined to have failed in LDPC decoding operation.

Referring to FIG. 6C, the syndrome check is a process of identifying whether the product result "H$\underline{v}^{iT}$" of the parity check matrix H and a vector "$\underline{v}$", which is obtained by the update of the variable nodes 620, satisfies the predetermined condition. When the product result "H$\underline{v}^{iT}$" becomes the zero vector, the product result "H$\underline{v}^{iT}$" may be evaluated to satisfy the predetermined condition.

FIG. 6C shows the syndrome check process. FIG. 6C exemplarily shows a non-zero vector "01000" as the product result "H$\underline{v}^{iT}$", and thus FIG. 6C shows that the syndrome check does not satisfy the predetermined condition and another iteration should be performed according to another hard decision read voltage $V_{HD}$.

Considering the nonzero vector "01000" as the product result "H$\underline{v}^{iT}$", the number of non-zero vector elements or elements, which do not meet the zero vector condition, is 2. In the description, the elements that do not meet the zero vector condition of the syndrome check for the product result "H$\underline{v}^{iT}$" in the single iteration are defined as an unsatisfied syndrome check (USC). FIG. 6C shows the result of the syndrome check where the number of the USC is 1.

Figure 7A:
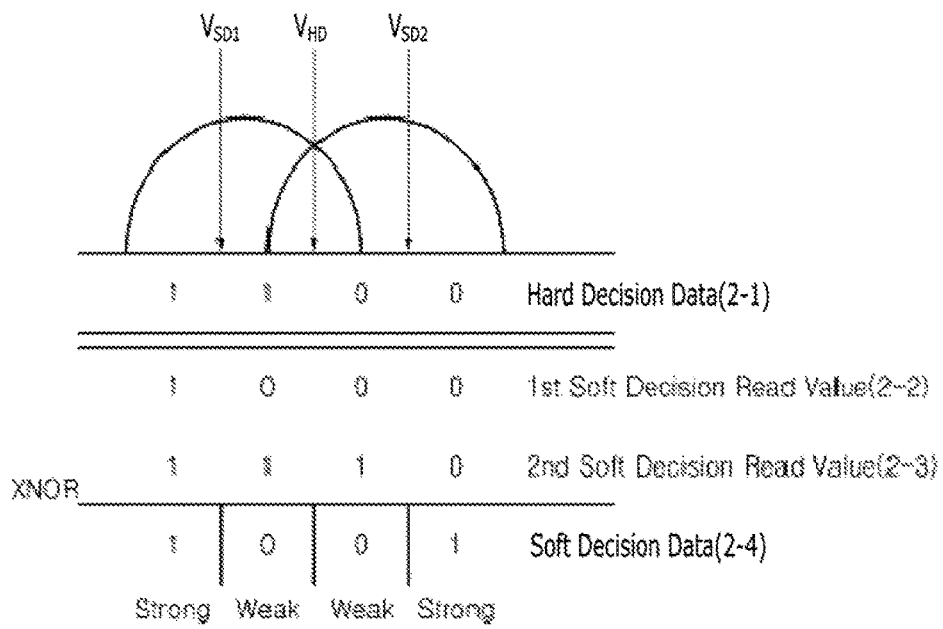
FIG. 7A is a schematic diagram illustrating a 2-bit soft decision read operation as a soft decision read operation shown in FIG. 5.
Figure 7B:
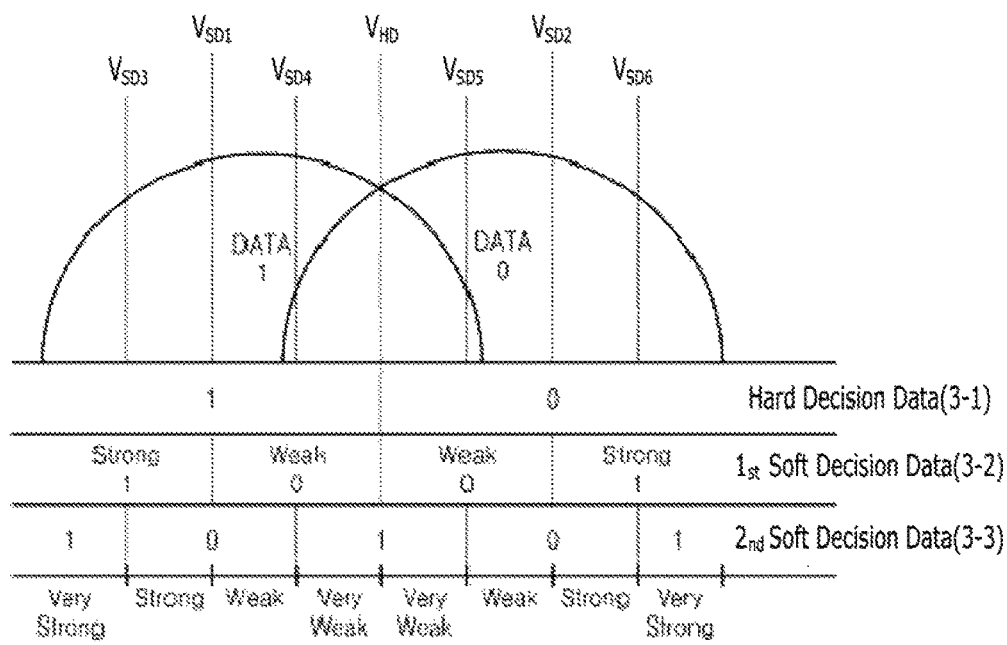
FIG. 7B is a schematic diagram illustrating a 3-bit soft decision read operation as a soft decision read operation shown in FIG. 5.

FIGS. 7A and 7B are schematic diagrams illustrating the soft decision read operation shown in FIG. 5, particularly 2-bit and 3-bit soft decision read operations, respectively.

Referring to FIG. 7A, during the hard decision decoding operation of step S510 described with reference to FIG. 5, the hard decision read data 2-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ and $V_{SD2}$, which have different levels from the hard decision read voltage $V_{HD}$, are applied to the memory cell.

Referring to FIG. 7A, during the 2-bit soft decision read operation, a first soft decision read value 2-2 may be '1000' according to the on/off status of a memory cell when the first soft decision read voltage $V_{SD1}$ is applied to the memory cell. In a similar way, a second soft decision read value 2-3 may be '1110' according to the on/off status of the memory cell when the second soft decision read voltages $V_{SD2}$ are applied to the memory cell.

For example, the ECC unit 130 may generate a soft decision read data 2-4 or the LLR through the XNOR operation to the first and second soft decision read values 2-2 and 2-3. The LLR 2-4 may show reliability of the hard decision read data 2-1.

For example, the value '1' of the soft decision read data 2-4 may show a "strong" probability of the first and second statuses, the logic values of '1' and '0', of the hard decision read data 2-1. Alternatively, the value '0' of the soft decision read data 2-4 may show a "weak" probability of the first and second statuses of the hard decision read data 2-1.

Referring to FIG. 7B, during the hard decision decoding operation of step S510 described with reference to FIG. 5, the hard decision read data 3-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ to $V_{SD6}$, which have different levels from the hard decision read voltage $V_{HD}$, are applied to the memory cell.

Referring to FIG. 7B, during the 3-bit soft decision read operation, first and second soft decision read values may be generated according to the on/off status of a memory cell when first and second soft decision read voltages $V_{SD1}$ and $V_{SD2}$ are applied to the memory cell which is similar to the 2-bit soft decision read operation described with reference to FIG. 7A. The ECC unit 130 may generate a first soft decision read data 3-2 '1001' or the LLR through an XNOR operation to the first and second soft decision read values.

In a similar way, during the 3-bit soft decision read operation, third to sixth soft decision read values may be generated according to the on/off status of the memory cell when third to sixth soft decision read voltages $V_{SD3}$ to $V_{SD6}$, which have different levels from the first and second soft decision read voltages $V_{SD1}$ and $V_{SD2}$ are applied to the memory cell, which is similar to the 2-bit soft decision read operation described with reference to FIG. 7A. The ECC unit 130 may generate a second soft decision read data 3-3 ('10101') or the LLR through the XNOR operation to the third to sixth soft decision read values. The LLR 3-3 ('10101') may provide a weighted value to the first soft decision read data 3-2.

For example, the value '1' of the second soft decision read data 3-3 may show a "very strong" probability of the first status, the logic value of '1', of the first soft decision read data 3-2. Alternatively, the value '0' of the second soft decision read data 3-3 may show a "strong" probability of the first status of the first soft decision read data 3-2.

In a similar way, the value '1' of the second soft decision read data 3-3 may show a "very weak" probability of the second status, the logic value of '0', of the first soft decision read data 3-2. Alternatively, the value '0' of the second soft decision read data 3-3 may show a "weak" probability of the second status of the first soft decision read data 3-2. The LLR 3-3 may provide a better reliability to the hard decision read data 3-1, which is similar to the 2-bit soft decision read operation described with reference to FIG. 7A.

Figures 8A, 8B:
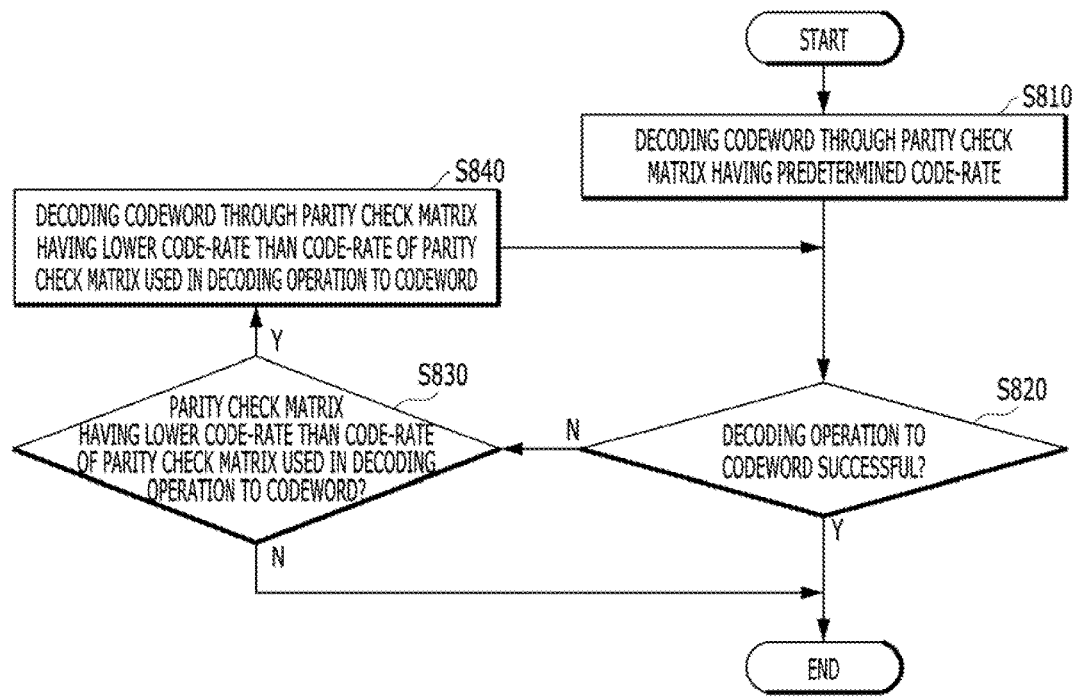
FIG. 8A is a schematic diagram illustrating a variable code-rate parity check matrix.
FIG. 8B is a flow chart illustrating a decoding operation of an ECC decoder in accordance with an embodiment of the present invention.

FIG. 8A is a schematic diagram illustrating a variable code-rate parity check matrix.

FIG. 8B is a flow chart illustrating a decoding operation of an ECC decoder in accordance with an embodiment of the present invention.

Hereinafter, described with reference to FIGS. 8A and 8B will be the variable code-rate parity check matrix, an encoding operation of encoding an original message with different code-rates by the ECC encoder 170 and a decoding operation of decoding the data, which are encoded with different code-rates, by the ECC decoder 180.

The variable code-rate parity check matrix H may include a plurality of parity check matrixes each having different code-rates, and may comprise (n−k+m) numbers of rows and (n+m) numbers of columns. Each of the parity check matrixes having different code-rates may have a size of (n−k+i)×(n+i), where "i" is an integer greater than zero (0) and smaller than "m". Accordingly, the variable code-rate parity check matrix H may include at the most (m+1) numbers of parity check matrixes each having different code-rates. The ECC decoder 180 may decode data, which are encoded with different code-rates, by using the parity check matrixes included in the variable code-rate parity check matrix H. When "k" represents a length of an original message, "n" represents a number of columns of the smallest parity check matrix H1 included in the variable code-rate parity check matrix H, and "n+m" represents a number of columns of the greatest parity check matrix H2 included in the variable code-rate parity check matrix H, "k" and "n" may be integers greater than 1 and may have a relationship of the following equation 1.

$$1 \leq k < n \qquad \text{[Equation 1]}$$

The variable code-rate parity check matrix H may be formed with "m" numbers of rows and numbers of columns respectively added to the rightmost column and the lowermost row of the smallest parity check matrix H1 having the size of (n−k)×(n). FIG. 8A exemplifies the variable code-rate parity check matrix H where "n" is 8, "k" is 5 and "m" is 2. Therefore, FIG. 8A exemplifies the smallest parity check matrix H1 of 3 rows and 8 columns and the greatest parity check matrix H2 of 5 rows and 10 columns included in the variable code-rate parity check matrix H.

In the variable code-rate parity check matrix H, elements located at the first to (n−k+i)th rows and the (n+i+1)th to (n+m)th columns may have a value of zero (0) while elements of the other locations may have a value of zero (0) or one (1). For example, as illustrated in FIG. 8A when "i" is zero (0), the elements located at the first to third rows and the ninth to tenth columns may have a value of zero (0). For example, as illustrated in FIG. 8A, when "i" is one (1), the elements located at the first to fourth rows and tenth column may have a value of zero (0)

For implementation of the variable code-rate parity check matrix H having lower encoding complexity, diagonal elements located on diagonal line running through locations at the first row and the (k+1)th column and the (n−k+m)th row and the (n+m)th column and elements located above the diagonal elements may preferably have a value of zero (0) in the variable code-rate parity check matrix H.

Among the parity check matrixes included in the variable code-rate parity check matrix H, the smallest parity check matrix H1 may have the highest code-rate, the greatest parity check matrix H2 may have the lowest code-rate, and the other parity check matrixes may have code-rates between the lowest and highest code-rates. The code-rate may be defined as the following equation 2.

$$R = \frac{k}{n+i} \qquad \text{[Equation 2]}$$

In equation 2, "R" may represent the code-rate and "i" may represent an integer between zero (0) and "m" respectively allocated to the parity check matrixes of the variable code-rate parity check matrix H in ascending order of their size that is, the smallest parity check matrix H1, the medium-sized parity check matrix H3 and the greatest parity check matrix H2.

FIG. 8A exemplifies the variable code-rate parity check matrix H formed with two (2) rows and two (2) columns respectively added to the rightmost column and the lowermost row of the smallest parity check matrix H1.

Referring to the variable code-rate parity check matrix H of FIG. 8A, the smallest parity check matrix HI may have eight (8) columns (i.e., n=8), the length of the original message is five (5) (i.e., k=5), and the greatest parity check matrix H2 may have ten (10) columns (i.e., n+m=10). Accordingly, a number of parity check matrixes included in the variable code-rate parity check matrix H may be ten (10) (i.e., n+m=8+2=10) and thus the variable code-rate parity check matrix H may include three (3) numbers of parity check matrixes H at the most. That is the variable code-rate parity check matrix H exemplified in FIG. 8A may include the smallest parity check matrix H1 having a size of (3×8), the greatest parity check matrix H2 having a size of (5×10) and medium-sized parity check matrix H3 having a size of (4×9).

Referring to the variable code-rate parity check matrix H of FIG. 8A, the smallest parity check matrix H1 may have the highest code-rate of 5/8, the greatest parity check matrix H2 may have the lowest code-rate of 5/10, and the medium-sized parity check matrix H3 may have a medium-sized code-rate of 5/9.

Referring to FIG. 8A, the ECC decoder 180 may decode data, which are encoded with different code-rates, by using one or more among the 3 parity check matrixes H1 to H3 included in the variable code-rate parity check matrix H.

Referring to FIG. 8A, elements located at the first to (n−k+i)th rows and the (n+i+1)th to (n+m)th columns may have a value of zero (0) in the variable code-rate parity check matrix H. For implementation of the variable code-rate parity check matrix H having lower encoding complexity, diagonal elements located on diagonal line running through locations at the first row and the (k+1) column and the (n−k+m) row and the (n+m)th column and elements located above the diagonal elements may preferably have a value of zero (0) in the variable code-rate parity check matrix H.

Hereinafter, described will be an embodiment of the present invention with the parity check matrixes, that is, the smallest parity check matrix H1 having a size of (3×8), the greatest parity check matrix H2 having a size of (5×10) and medium-sized parity check matrix H3 having a size of (4×9), included in the variable code-rate parity check matrix H.

The variable code-rate parity check matrix H may have a relationship with a variable code-rate generation matrix G as defined in the following equation 3.

$$G \times H^T = 0 \qquad \text{[Equation 3]}$$

In equation 3, "G" may represent the variable code-rate generation matrix, "H" may represent the variable code-rate parity check matrix, and "$H^T$" may represent the transposed matrix of the variable code-rate parity check matrix H. When the variable code-rate parity check matrix H is given, the variable code-rate generation matrix G may be obtained through equation 3. Further, code-rate generation matrixes respectively corresponding to the parity check matrixes included in the variable code-rate parity check matrix H may be obtained through equation 3. That is, a first code-rate generation matrix G1 corresponding to the parity check matrix H1, a second code-rate generation matrix G2 corresponding to the parity check matrix H2, and a third code-rate generation matrix G3 corresponding to the parity check matrix H3 may be obtained through equation 3.

Hereinafter, described will be an example case where the ECC encoder 170 encodes an original message with different code-rates by using the code-rate generation matrixes respectively corresponding to the parity check matrixes included in the variable code-rate parity check matrix H.

The ECC encoder 170 may generate encoded data or codewords by multiplying the original message with the code-rate generation matrixes having different code-rates according to page statuses of the memory block 211 to store the encoded data.

For example, when the error-rate of the least significant bit (LSB) page is lower than the error-rate of the most significant bit (MSB) page in the memory block 211, the ECC encoder 170 may generate a first encoded data or a first codeword by multiplying an original message with the first code-rate generation matrix G1 having the highest code-rate and may store the first codeword to the LSB page of the memory block 211 while the ECC encoder 170 may generate a second encoded data or a second codeword by multiplying an original message with the second code-rate generation matrix G2 having the lowest code-rate and may store the second codeword to the MSB page of the memory block 211.

When the page which stores the encoded data has a good status in the memory block 211 or when a raw bit error-rate (RBER) of the page for a required word error-rate (WER) is high, the ECC encoder 170 may encode an original data through the code-rate generation matrix G having a relatively higher code-rate. Alternatively, when the page which stores the encoded data has a poor status in the memory block 211 or when the RBER of the page for the required WER is low, the ECC encoder 170 may encode an original data through the code-rate generation matrix G having a relatively lower code-rate.

Accordingly, when the encoded data is stored in the LSB page having a relatively lower error-rate in the memory block 211, the ECC encoder 170 may generate the first encoded data or the first codeword by multiplying the original message with the first code-rate generation matrix G1 having a relatively higher code-rate while when the encoded data is stored in the MSB page having a relatively higher error-rate in the memory block 211, the ECC encoder 170 may generate the second encoded data or the second codeword by multiplying the original message with the second code-rate generation matrix G2 having a relatively lower code-rate.

When the status of the page which stores the encoded data becomes poorer than before in the memory block 211 or when the WER becomes higher than before, the ECC encoder 170 may encode an original data through the code-rate generation matrix G having a relatively lower code-rate than the code-rate of the previously used code-rate generation matrix G. For example, when the status of the LSB page becomes poorer than before, the ECC encoder 170 encodes an original data through the second or third code-rate generation matrix G2 or G3 having relatively lower code-rate than the code-rate of the previously used first code-rate generation matrix G1.

The memory interface 150 may store the codeword into the memory block 211. The memory interface 150 may store the codeword into the memory block 211 according to the code-rate of the codeword. For example, the memory interface 150 may store the second codeword having a lower code-rate into the MSB page of the memory block 211 while storing the first codeword having a higher code-rate into the LSB page of the memory block 211.

Further, the memory interface 150 may divide the codeword and store the divided codeword into the respective pages of the memory block 211 such that each page stores codewords of the same size. For example, when the ECC encoder 170 generates the first codeword of 8 bits from an original message of 5 bits through the first code-rate generation matrix G1 and generates the second codeword of 10 bits from an original message of 5 bits through the second code-rate generation matrix G2, the memory interface 150 may store 9 bits out of the 10-bit second codeword into the MSB page while storing the remaining 1 bit of the 10-bit second codeword and the 8-bit first codeword into the LSB page of the memory block 211. That is, the memory interface 150 may store the same sized for example, 9-bit codewords into each of the LSB and MSB pages by dividing the 10-bit second codeword.

Hereinafter, described with reference to FIGS. 8A and 8B will be a case in which the ECC decoder 180 decodes codewords through the parity check matrixes having different code-rates.

The ECC decoder 180 may restore an original message or generate a decoded message by decoding the first codeword, which is read from the memory block 211, through one of the parity check matrixes included in the variable code-rate parity check matrix H. Further, the ECC decoder 180 may restore an original message or generate a decoded message by decoding the second codeword, which is read from the memory block 211, through one of the parity check matrixes included in the variable code-rate parity check matrix H.

That is, the ECC decoder 180 may restore an original message or generate a decoded message by decoding the first and second codewords, which are read from the memory block 211, through one or more of the parity check matrixes included in the variable code-rate parity check matrix H.

FIG. 8B is a flow chart illustrating a decoding operation by the ECC decoder 180 to codewords, which are read from the memory block 211, with the parity check matrixes included in the variable code-rate parity check matrix H in accordance with an embodiment of the present invention.

Referring to FIG. 8B, at step S810 the ECC decoder 180 may decode a codeword, which is read from the memory block 211, with a parity check matrix having a predetermined code-rate. The parity check matrix having the predetermined code-rate may be the smallest parity check matrix H1 or a parity check matrix corresponding to a code-rate generation matrix used in the encoding operation of generating the codeword. For example, when the codeword read from the memory block 211 has been encoded by the first code-rate generation matrix G1 corresponding to the parity check matrix H1, the ECC decoder 180 may decode the codeword with the parity check matrix H1.

At step S820, the ECC decoder 180 may determine the decoding operation of step S810 is successful. When the decoding operation of step S810 is determined to be successful as a result of step S820, the process may end. When the decoding operation of step S810 is determined to be a failure as a result of step S820, the ECC decoder 180 may determine whether there is a parity check matrix having a lower code-rate than the code-rate of the previously used parity check matrix at step S830. When the ECC decoder 180 determines that there is not a parity check matrix having a lower code-rate than the code-rate of the previously used parity check matrix as a result of step S830, the decoding operation may be determined to be a failure and the process may end.

When the ECC decoder 180 determines that there is a parity check matrix having a lower code-rate than the code-rate of the previously used parity check matrix as a result of step S830, the ECC decoder 180 may decode the codeword with the parity check matrix having a lower code-rate than the code-rate of the previously used parity check matrix at step S840. For example, when the ECC decoder 180 uses the parity check matrix H1 for the decoding operation to a codeword at step S810, the ECC decoder 180 may decode the codeword through a parity check matrix for example, the parity check matrix H2 or the parity check matrix H3 having lower code-rate than the code-rate of the parity check matrix H1 at step S840.

Figure 9:
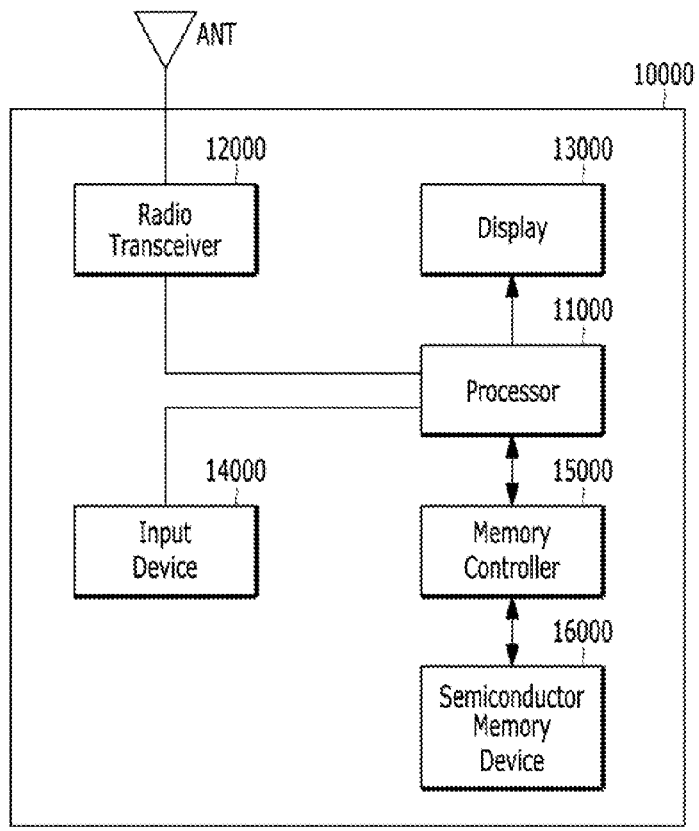
FIG. 9 is a block diagram schematically illustrating an electronic apparatus including a semiconductor memory system in accordance with an embodiment of the present invention.

FIG. 9 is a block diagram schematically illustrating an electronic apparatus 10000 including a memory controller 15000 and a semiconductor memory device 16000 in accordance with an embodiment of the present invention.

Referring to FIG. 9, the electronic apparatus 10000 may be any suitable electronic apparatus such as a cellular phone, a smart phone, or a tablet PC including the semiconductor memory device 16000 and the memory controller 15000. The semiconductor memory device 16000 may be implemented by any suitable memory device, including, for example, a flash memory device, such as NAND or a NOR flash. The memory controller 15000 may control the semiconductor memory device 16000.

The semiconductor memory device 16000 may correspond to the semiconductor memory device 200 described above with reference to FIGS. 3 to 4B. The semiconductor memory device 16000 may store random data.

The memory controller 15000 may correspond to the memory controller 100 described with reference to FIGS. 3 to 8E. The memory controller 15000 may be controlled by a processor 11000 which may control overall operations of the electronic apparatus 10000.

Data stored in the semiconductor memory device 16000 may be displayed through a display 13000 under the control of the memory controller 15000. The memory controller 15000 may operate under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000. The input device 14000 may be implemented, for example by a pointing device such as a touch pad, a computer mouse, a key pad, or a keyboard.

The processor 11000 may control the display 13000 so that the data from the semiconductor memory device 16000, the radio signal from the radio transceiver 12000 or the data from the input device 14000 is displayed through the display 13000.

Figure 10:
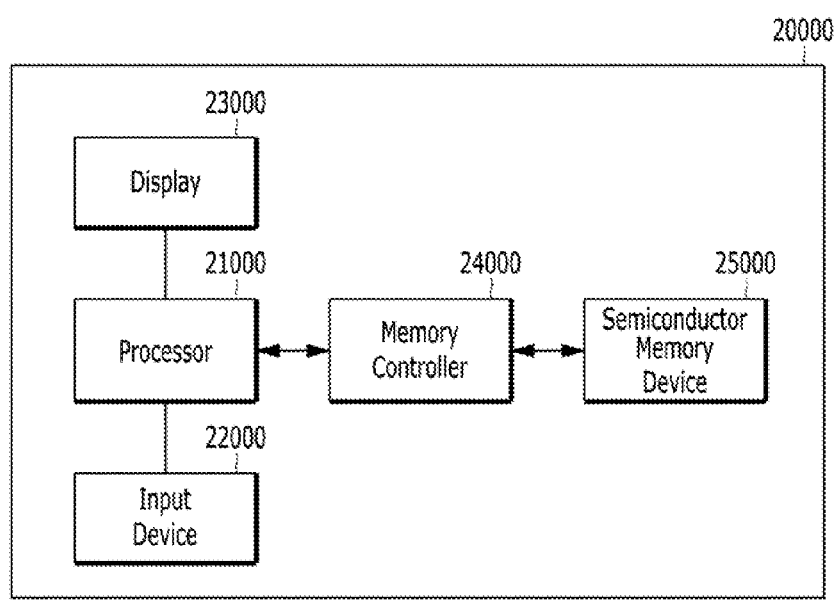
FIG. 10 is a block diagram schematically illustrating an electronic apparatus including a semiconductor memory system in accordance with another embodiment of the present invention.

FIG. 10 is a block diagram schematically illustrating an electronic apparatus 20000 including a memory controller 24000 and a semiconductor memory device 25000 in accordance with another embodiment of the present invention.

The memory controller 24000 and the semiconductor memory device 25000 may correspond to the memory controller 100 and the semiconductor memory device 200 described with reference to FIGS. 3 to 8E, respectively.

Referring to FIG. 10, the electronic apparatus 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, for example, a flash memory device, and the memory controller 24000 to control the operations of the semiconductor memory device 25000.

The electronic apparatus 20000 may include a processor 21000 to control overall operations of the electronic apparatus 20000. The memory controller 24000 may be controlled by the processor 21000.

The processor 21000 may display data stored in the semiconductor memory device 25000 through a display 23000 according to an input signal from an input device 22000. For example, the input device 22000 may be implemented, for example, by a pointing device such as a touch pad, a computer mouse, a key pad, or a keyboard.

Figure 11:
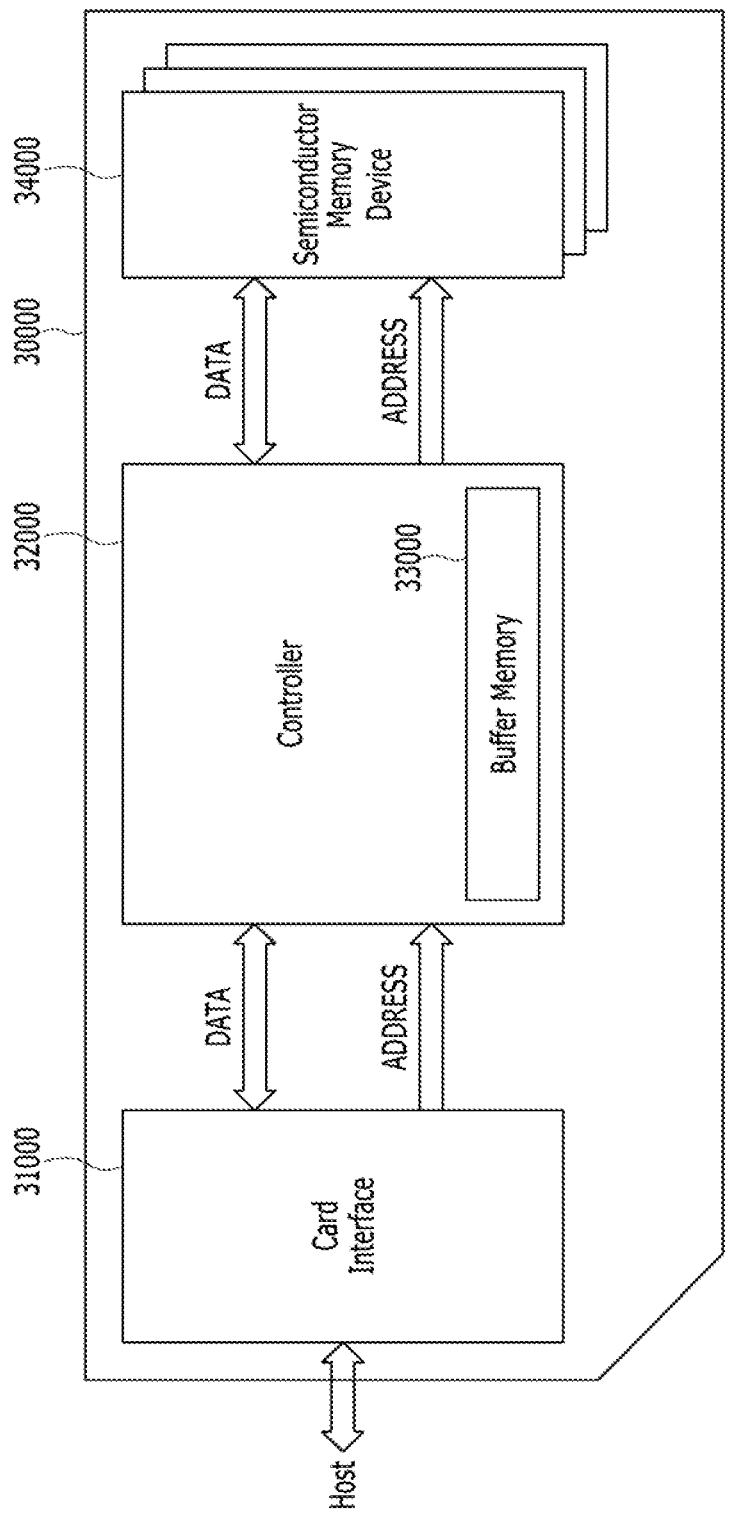
FIG. 11 is a block diagram schematically illustrating an electronic apparatus including a semiconductor memory system in accordance with yet another embodiment of the present invention.

FIG. 11 is a block diagram schematically illustrating an electronic apparatus 30000 including a controller 32000 and a semiconductor memory device 34000, in accordance with yet another embodiment of the present invention.

The controller 32000 and the semiconductor memory device 34000 may correspond to the memory controller 100 and the semiconductor memory device 200 described with reference to FIGS. 3 to 8E, respectively.

Referring to FIG. 11, the electronic apparatus 30000 may include a card interface 31000, the controller 32000, and the semiconductor memory device 34000 which may be implemented, for example, with a flash memory device.

The electronic apparatus 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic apparatus 30000.

The controller 32000 may control the overall operations of the electronic apparatus 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic apparatus 30000 is connected with the host such as a PC, a tablet PC, a digital camera, a digital audio player, a mobile phone, console video game hardware or a digital set-top box the host may exchange data with the semiconductor memory device 34000 through the card interface 31000 and the controller 32000.

Figure 12:
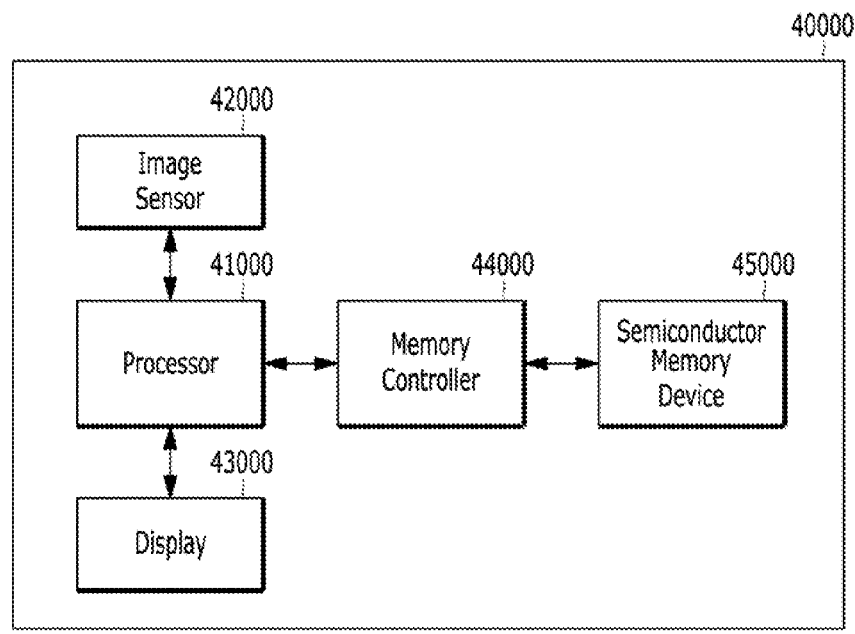
FIG. 12 is a block diagram schematically illustrating an electronic apparatus including a semiconductor memory system in accordance with yet another embodiment of the present invention.

FIG. 12 is a block diagram schematically illustrating an electronic apparatus 40000 including a memory controller 44000 and a semiconductor memory device 45000 in accordance with yet another embodiment of the present invention.

The memory controller 44000 and the semiconductor memory device 45000 may correspond to the memory controller 100 and the semiconductor memory device 200 described with reference to FIGS. 3 to 8E, respectively.

Referring to FIG. 12, the electronic apparatus 40000 may include the semiconductor memory device 45000, for example, a flash memory device, the memory controller 44000 to control a data processing operation of the semiconductor memory device 45000, and a processor 41000 to control overall operations of the electronic apparatus 40000.

Further, an image sensor 42000 of the electronic apparatus 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 13:
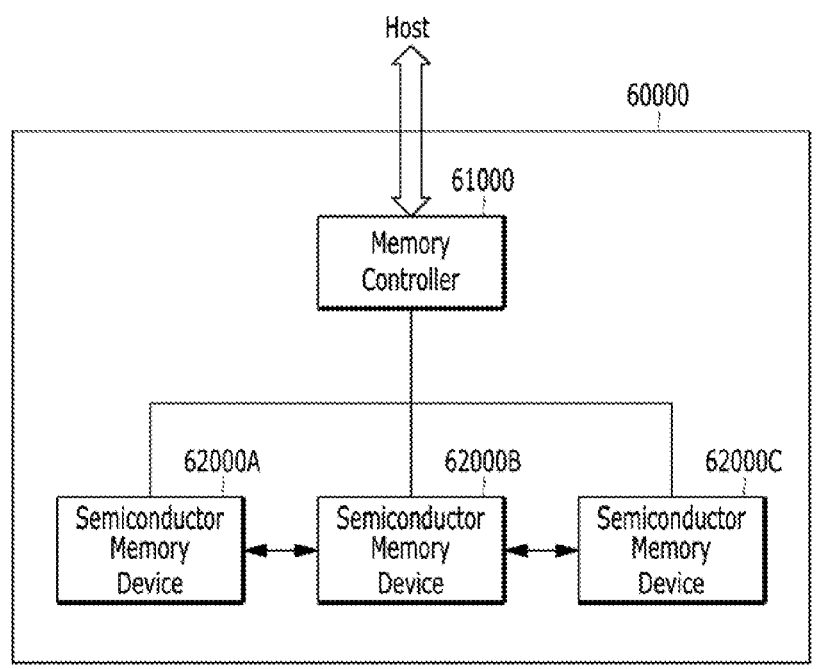
FIG. 13 is a block diagram schematically illustrating an electronic apparatus including a semiconductor memory system in accordance with yet another embodiment of the present invention.

FIG. 13 is a block diagram schematically illustrating an electronic apparatus 60000 including a memory controller 61000 and semiconductor memory devices 62000A, 620003, and 62000C, in accordance with yet another embodiment of the present invention.

The memory controller 61000 and each of the semiconductor memory devices 62000A 620003 and 62000C may correspond to the memory controller 100 and the semiconductor memory device 200 described with reference to FIGS. 3 to 8E, respectively.

Referring to FIG. 13, the electronic apparatus 60000 may be implemented by a data storage device such as a solid state drive (SSD).

The electronic apparatus 60000 may include the plurality of semiconductor memory devices 62000A, 62000B, and 62000C and the memory controller 61000 to control a data processing operation of each of the semiconductor memory devices 62000A, 62000B, and 62000C.

The electronic apparatus 60000 may be implemented by a memory system or a memory module.

For example, the memory controller 61000 may be implemented outside or inside the electronic apparatus 60000.

Figure 14:
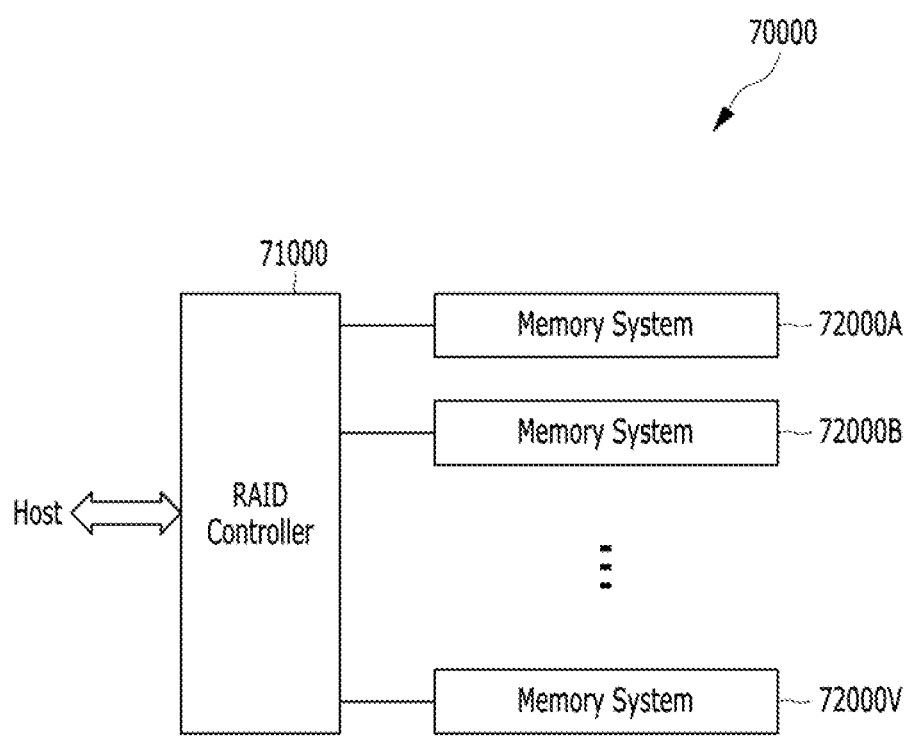
FIG. 14 is a block diagram of a data processing system including the electronic apparatus shown in FIG. 13.

FIG. 14 is a block diagram of a data processing system including the electronic apparatus 6000 described with reference to FIG. 13.

Referring to FIGS. 13 and 14 a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic apparatus 60000 described with reference to FIG. 13. The memory systems 72000A to 72000N may form a RAID array. The data storage device 70000 may be implemented by an SSD.

During a program operation, the RAID controller 71000 may output program data, which is output from a host to one of the memory systems 72000A to 72000N selected according to one of a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to specific embodiments, it will be apparent to those skilled in the art that various changes and modifications may be made without departing from the spirit and scope of the invention as defined in the following claims.

What is claimed is:

1. An operation method for a memory controller, the operation method comprising:
   encoding a first data at a first code-rate such that the encoded first data is decoded by a first parity check matrix included in a variable code-rate parity check matrix; and
   encoding a second data at a second code-rate such that the encoded second data is decoded by a second parity check matrix included in the variable code-rate parity check matrix.

2. The operation method of claim 1 further comprising:
   storing the encoded first data into a first page of a memory block; and
   storing the encoded second data into a second page of the memory block.

3. The operation method of claim 1,
   further comprising:
   storing the encoded first data into a first page of respective memory blocks;
   storing a first portion of the encoded second data into the first page of the respective memory blocks; and
   storing a second portion of the encoded second data into a second page of the respective memory blocks,
   wherein a summed size of the encoded first data and the first portion of the encode second data stored in the first page is the same as a size of the second portion of the encoded second data stored in the second page.

4. The operation method of claim 1, wherein the first parity check matrix is included in the second parity check matrix.

5. The operation method of claim 1, wherein the first code-rate is higher than the second code-rate.

6. The operation method of claim 1,
wherein, in the variable code-rate parity check matrix, elements located at first to (n−k+i)th rows and (n+i+1)th to (n+m)th columns have a value of zero (0), and
wherein the k represents a size of the first data, the n represents a number of columns of the first parity check matrix the m represent a number of columns of the variable code-rate parity check matrix minus the number of columns of the first parity check matrix, and the represents an integer between zero (0) and (m−1).

7. The operation method of claim 6, wherein, in the variable code-rate parity check matrix, diagonal elements located on diagonal line running through locations at a first row and (k+1)th column and a (n−k+m)th row and a (n+m)th column and elements located above the diagonal elements have a value of zero (0).

8. An operation method for a controller, the operation method comprising:
reading a first data, which is encoded at a first code-rate, and a second data, which is encoded at a second code-rate, from respective memory blocks;
decoding the first data through a first parity check matrix included in a variable code-rate parity check matrix; and
decoding the second data through a second parity check matrix included in the variable code-rate parity check matrix.

9. The operation method of claim 8,
wherein the first data is stored in a first page of the respective memory blocks, and
wherein the second data is stored in a second page of the respective memory blocks.

10. The operation method of claim 8,
wherein the first data is a first portion of data stored in a first page of the respective memory blocks,
wherein the second data is a second portion of data stored in the first page of the respective memory blocks and data stored in a second page of the respective memory blocks, and
wherein a size of data stored in the first page is the same sa size of data stored in the second page.

11. The operation method of claim 8, wherein the first parity check matrix is included in the second parity check matrix.

12. The operation method of claim 8, wherein the first code-rate is higher than the second code-rate.

13. The operation method of claim 8
wherein, in the variable code-rate parity check matrix, elements located at first to (n−k+i)th rows and (n+i+1)th to (n+m)th columns have a value of zero (0), and
wherein the k represents a size of the first data, the n represents a number of columns of the first parity check matrix the m represent a number of columns of the variable code-rate parity check matrix minus the number of columns of the first parity check matrix, and the i represents an integer between zero (0) and (m−1).

14. The operation method of claim 13, wherein in the variable code-rate parity check matrix diagonal elements located on diagonal line running through locations at a first row and (k+i)th column and a (n−k+m)th row and a (n+m)th column and elements located above the diagonal elements have a value of zero (0).

15. A controller comprising:
a first means for encoding a first data at a first code-rate and for encoding a second data at a second code-rate;
a second means for storing the encoded first and second data into respective memory blocks;
a third means for reading the encoded first data and the encoded second data from the respective memory blocks; and
a fourth means for decoding the encoded first data through a first parity check matrix included in a variable code-rate parity check matrix, and decoding the encoded second data through a second parity check matrix included in the variable code-rate parity check matrix.

16. The controller of claim 15, wherein the second means stores the encoded first data into a first page of the respective memory blocks, and the encoded second data into a second page of the respective, memory blocks.

17. The controller of claim 15,
wherein the second means stores the encoded first data into a first page of the respective memory blocks, a first portion of the encoded second data into the first page of the respective memory blocks, and a second portion of the encoded second data into a second page of the respective memory blocks, and
wherein a summed size of the encoded first data and the first portion of the encoded second data stored in the first page is the same as a size of the second portion of the encoded second data stored in the second page.

18. The controller of claim 15, wherein the first parity check matrix is included in the second parity check matrix.

19. The controller of claim 15,
wherein, in the variable code-rate parity check matrix, elements located at first to (n−k+i)th rows and (n+i+1)th to (n+m)th columns have a value of zero (0), and
wherein the k represents a size of the first data, the n represents a number of columns of the first parity check matrix the m represent a number of columns of the variable code-rate parity check matrix minus the number of columns of the first parity check matrix, and the i represents an integer between zero (0) and (m−1).

20. The controller of claim 19, wherein in the variable code-rate parity check matrix, diagonal elements located on diagonal line running through locations at a first row and (k+1)th column and a (n−k+m)th row and a (n+m)th column and elements located above the diagonal elements have a value of zero (0).

* * * * *